(12) United States Patent
Cheng et al.

(10) Patent No.: US 10,396,179 B2
(45) Date of Patent: Aug. 27, 2019

(54) FORMING VERTICAL TRANSPORT FIELD EFFECT TRANSISTORS WITH UNIFORM BOTTOM SPACER THICKNESS

(71) Applicant: INTERNATIONAL BUSINESS MACHINES CORPORATION, Armonk, NY (US)

(72) Inventors: Kangguo Cheng, Schenectady, NY (US); Xuefeng Liu, Albany, NY (US); Peng Xu, Guilderland, NY (US); Yongan Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/948,563

(22) Filed: Apr. 9, 2018

(65) Prior Publication Data

US 2018/0315835 A1    Nov. 1, 2018

Related U.S. Application Data

(62) Division of application No. 15/498,112, filed on Apr. 26, 2017, now Pat. No. 9,991,365.

(51) Int. Cl.
| | |
|---|---|
| *H01L 29/786* | (2006.01) |
| *H01L 29/66* | (2006.01) |
| *H01L 29/78* | (2006.01) |
| H01L 29/08 | (2006.01) |
| H01L 29/49 | (2006.01) |
| H01L 21/311 | (2006.01) |

(52) U.S. Cl.
CPC .... *H01L 29/66666* (2013.01); *H01L 29/6656* (2013.01); *H01L 29/7827* (2013.01); *H01L 21/31144* (2013.01); *H01L 29/0847* (2013.01); *H01L 29/4966* (2013.01)

(58) Field of Classification Search
CPC ....... H01L 29/78642; H01L 21/823487; H01L 21/823885
See application file for complete search history.

(56) References Cited

U.S. PATENT DOCUMENTS

| | | |
|---|---|---|
| 5,340,757 A | 8/1994 | Chantre et al. |
| 5,504,359 A | 4/1996 | Rodder |
| 5,631,482 A | 5/1997 | Hong |
| 5,654,212 A | 8/1997 | Jang |
| 6,118,159 A | 9/2000 | Willer et al. |

(Continued)

FOREIGN PATENT DOCUMENTS

TW         233377 B        11/1994

*Primary Examiner* — Mark V Prenty
(74) *Attorney, Agent, or Firm* — Tutunjian & Bitetto, P.C.; Vazken Alexanian

(57) ABSTRACT

A method of forming a vertical transport field effect transistors with uniform bottom spacer thickness, including, forming a plurality of vertical fins on a substrate, forming a protective liner layer on the plurality of vertical fins, forming a sacrificial liner on the protective liner layer, forming a spacer liner on a portion of the sacrificial liner, wherein at least a top surface of the sacrificial liner on each of the vertical fins is exposed, converting the exposed portion of the sacrificial liner on each of the vertical fins to a conversion cap, and removing the conversion cap from each of the vertical fins to expose an upper portion of each vertical fin.

17 Claims, 9 Drawing Sheets

(56) References Cited

U.S. PATENT DOCUMENTS

| | | |
|---|---|---|
| 6,406,962 B1 | 6/2002 | Agnello et al. |
| 6,707,095 B1 | 3/2004 | Chidambarrao et al. |
| 6,737,316 B2 | 5/2004 | Lee |
| 7,663,164 B2 | 2/2010 | Tien et al. |
| 7,998,772 B2 | 8/2011 | Tien et al. |
| 9,991,365 B1 * | 6/2018 | Cheng ............... H01L 29/66666 |
| 10,026,827 B2 * | 7/2018 | Wu ................... H01L 29/66795 |
| 2015/0129982 A1 | 5/2015 | Kerber et al. |
| 2015/0380548 A1 * | 12/2015 | Wang ................. H01L 29/7827 |
| | | 257/329 |
| 2016/0240665 A1 | 8/2016 | Chen et al. |

\* cited by examiner

FORMING VERTICAL TRANSPORT FIELD EFFECT TRANSISTORS WITH UNIFORM BOTTOM SPACER THICKNESS

BACKGROUND

Technical Field

The present invention generally relates to forming a plurality of vertical transport field effect transistors (VT-FETs) with uniform bottom spacer thickness, and more particularly to utilizing a combination of fin liners and conversion reactions to control the thickness of bottom spacers formed between VTFETs.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (nFET) or a p-type FET (pFET) can be formed. An nFET and a pFET can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of forming vertical transport field effect transistors with uniform bottom spacer thickness is provided. The method includes forming a plurality of vertical fins on a substrate, forming a protective liner layer on the plurality of vertical fins. The method further includes forming a sacrificial liner on the protective liner layer, forming a spacer liner on a portion of the sacrificial liner, wherein at least a top surface of the sacrificial liner on each of the vertical fins is exposed. The method further includes converting the exposed portion of the sacrificial liner on each of the vertical fins to a conversion cap. The method further includes removing the conversion cap from each of the vertical fins to expose an upper portion of each vertical fin.

In accordance with another embodiment of the present invention, a method of forming a vertical transport field effect transistors with uniform bottom spacer thickness is provided. The method includes forming a plurality of vertical fins on a substrate. The method further includes forming a protective liner layer on the plurality of vertical fins. The method further includes forming a sacrificial liner on the protective liner layer. The method further includes forming a spacer liner on a portion of the sacrificial liner, wherein at least a top surface of the sacrificial liner on each of the vertical fins and at least a portion of the sacrificial liner on the substrate is exposed. The method further includes reacting the exposed portion of the sacrificial liner on each of the vertical fins and substrate with a reactive species to convert the exposed portion of the sacrificial liner into a conversion cap on each of the vertical fins and a conversion segment on the substrate.

In accordance with yet another embodiment of the present invention, a vertical transport field effect transistor with uniform bottom spacer thickness is provided. The vertical transport field effect transistor includes a plurality of vertical fins on a substrate. The vertical transport field effect transistor further includes a plurality of protective liner segments on the substrate. The vertical transport field effect transistor further includes a conversion segment on each of the plurality of protective liner segments. The vertical transport field effect transistor further includes a gate dielectric layer on the conversion segment, and a top source/drain on each of the plurality of vertical fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to altering the formation process for a bottom spacer using conformal depositions and chemical reactions that convert the material of a precursor layer to a bottom spacer rather than direct depositions or etch-back processes that can result in non-uniform bottom spacer thicknesses due to the spacing between vertical fins. The controlled conformal layer deposition and material conversion can provide a uniform bottom spacer thickness between vertical fins with narrow or varying spacing.

Embodiments of the present invention relate generally to forming fin field effect transistors (FinFETs) with a bottom spacer formed by a protective liner segment and a conversion segment, where the protective liner segment and a conversion segment have a more uniform thickness that a bottom spacer formed by a directional deposition and/or a deposition and etch-back process.

Exemplary applications/uses to which the present invention can be applied include, but are not limited to: vertical field effect transistor devices.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. As further described herein, the source and drain also can be different due to fabrication with different materials providing different electrical properties. In addition, the role of source and drain for an active device can in some instances be reversed, so a previously indicated drain may instead be a source and vice versa. Reference to a source/drain is, therefore, intended to encompass the broadest reasonable scope of the term.

Figure 1:
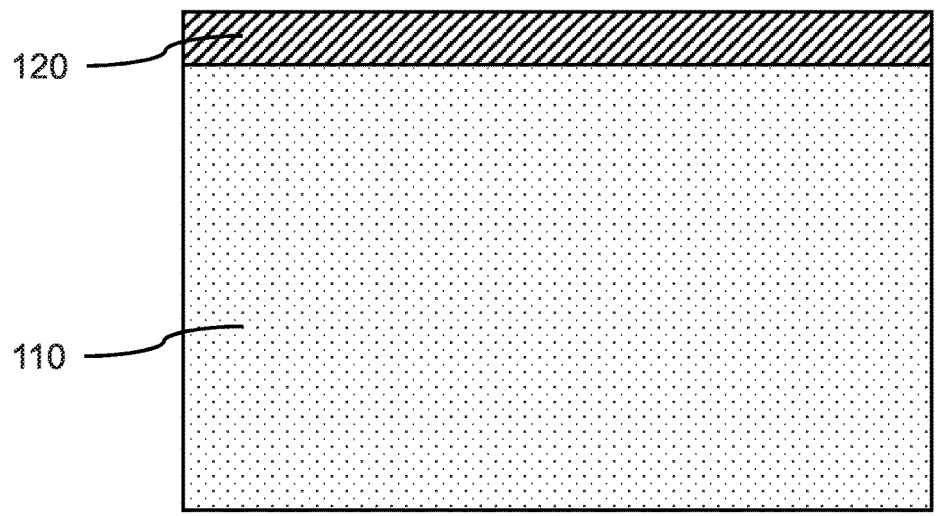
FIG. 1 is a cross-sectional side view showing a fin mask layer on a substrate, in accordance with an embodiment of the present invention.

Referring now to the drawings in which like numerals represent the same or similar elements and initially to FIG. 1, a cross-sectional side view of a fin mask layer on a substrate, in accordance with an embodiment of the present invention, is shown.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $Al_2O_3$, $SiO_2$, GaAs, SiC, Si:C, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). In one or more embodiments, the substrate 110 can be a single crystal silicon wafer.

In one or more embodiments, a fin template layer 120 can be formed on the substrate 110, where the fin template layer 120 can be a hardmask. The fin template layer 120 can be blanket deposited, for example, by CVD or PECVD on the exposed surface of the substrate 110.

In various embodiments, the fin template layer 120 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof, where the fin template layer 120 may include one or more layers.

Figure 2:
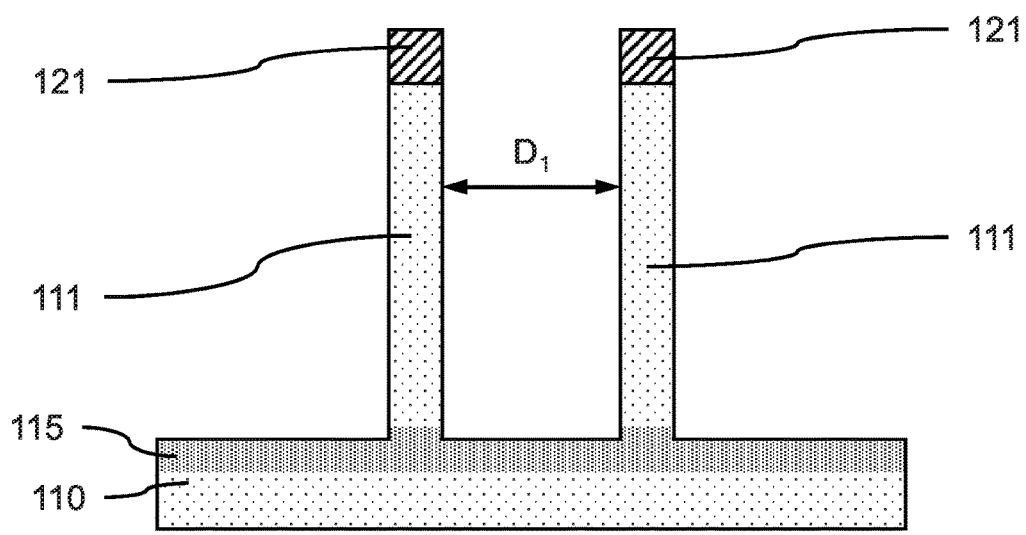
FIG. 2 is a cross-sectional side view showing a fin template on each of a plurality of vertical fins, in accordance with an embodiment of the present invention.

FIG. 2 is a cross-sectional side view showing a fin template on each of a plurality of vertical fins, in accordance with an embodiment of the present invention.

In one or more embodiments, the fin template layer 120 can be patterned to form one or more fin templates 121 on the substrate 110. The portion of the substrate 110 not masked by the fin template(s) 121 can be removed to a predetermined depth to form one or more vertical fins 111. The vertical fin(s) 111 can have a predetermined height, width, and length (i.e., into the plane of the drawings).

In various embodiments, a plurality of vertical fins 111 can be formed by a sidewall image transfer (SIT) process, self-aligned double patterning (SADP) process, or self-aligned quadruple patterning (SAQP) process, to provide a tight pitch between vertical fins 111. In various embodiments, a direct print can be used to provide the fin templates 121 from the fin template layer 120. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. These and other processes are also contemplated, and the scope of the claims and invention should not be limited to the particular illustrated features.

In one or more embodiments, the vertical fins 111 can have a height in the range of about 30 nm to about 90 nm, and a width in the range of about 5 nm to about 30 nm. In various embodiments, the vertical fin can be separated by a distance, $D_1$, in the range of about 5 nm to about 50 nm, or in the range of about 10 nm to about 30 nm, where the separation distance, $D_1$, can cause the height of a filler or spacer to vary due to access of deposition or etching species into the gaps between vertical fins 111.

In one or more embodiments, the fin templates 121 can be removed by a selective etch (e.g., wet isotropic etch, dry plasma etch, or reactive ion etch).

In one or more embodiments, a bottom source/drain layer 115 can be formed at the surface of the substrate 110, where the bottom source drain layer 115 may be formed from the substrate surface material (e.g., through dopant implantation) or formed on the substrate surface (e.g., by epitaxial growth and in situ or ex situ dopant implantation).

In various embodiments, the bottom source/drain layer 115 can be formed by epitaxial growth on an exposed portion of the substrate 110, and/or dopants can be implanted into the bottom source/drain layer 115. The bottom source/drain layer 115 can be in-situ doped (where doping and epitaxy growth are performed at the same time), and/or ex-situ doped (where doping occurs before and/or after epitaxy). Dopants can be incorporated during epitaxy or by other suitable doping techniques. In various embodiments, the bottom source/drain layer 115 can be doped to form n-type or p-type source/drains to fabricate NFETs or PFETs.

Figure 3:
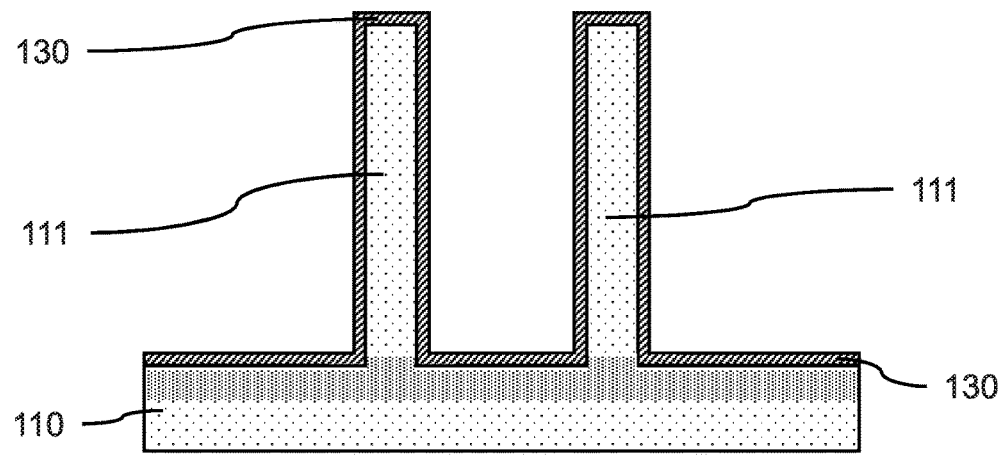
FIG. 3 is a cross-sectional side view showing a protective liner layer on the vertical fins and the exposed surface of the substrate, in accordance with an embodiment of the present invention.

FIG. 3 is a cross-sectional side view showing a protective liner layer on the vertical fins and the exposed surface of the substrate, in accordance with an embodiment of the present invention.

In one or more embodiments, a protective liner layer 130 can be formed on the exposed surfaces of the vertical fins 111 and substrate 110, where the protective liner layer 130 can be formed by a conformal deposition, for example, atomic layer deposition (ALD) or plasma enhanced atomic layer deposition (PEALD).

In one or more embodiments, the protective liner layer 130 can be silicon nitride (SiN).

In one or more embodiments, the protective liner layer 130 can have a thickness in the range of about 2 nm to about 5 nm.

Figure 4:
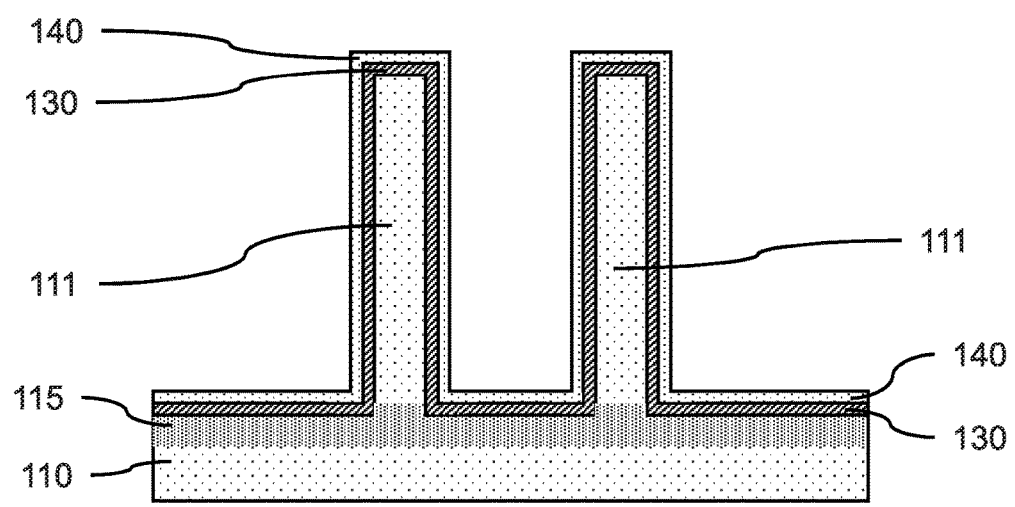
FIG. 4 is a cross-sectional side view showing a sacrificial liner on the protective liner layer, in accordance with an embodiment of the present invention.

FIG. 4 is a cross-sectional side view showing a sacrificial liner on the protective liner layer, in accordance with an embodiment of the present invention.

In one or more embodiments, a sacrificial liner 140 can be formed on the protective liner layer 130, where the sacrificial liner 140 can be formed by a conformal deposition (e.g., ALD, PEALD).

In one or more embodiments, the sacrificial liner 140 can be silicon (Si), including polycrystalline silicon (poly-Si), amorphous silicon (a-Si), microcrystalline silicon (μm-Si), and/or silicon-germanium (SiGe).

In one or more embodiments, the sacrificial liner 140 can have a thickness in the range of about 2 nm to about 5 nm.

Figure 5:
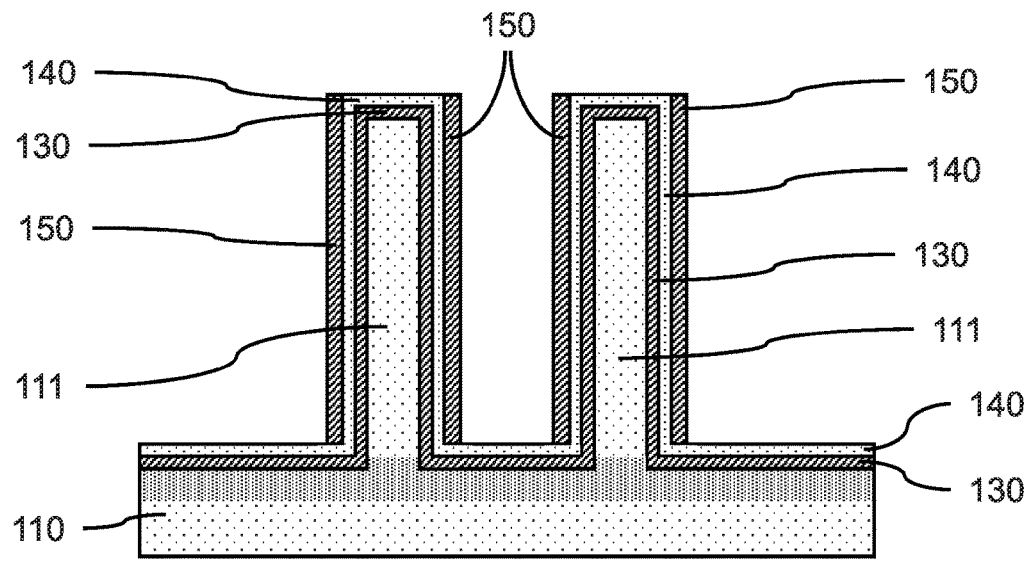
FIG. 5 is a cross-sectional side view showing a spacer liner on the vertical sidewalls of the sacrificial liner, and an exposed portion of the sacrificial liner on the horizontal surfaces, in accordance with an embodiment of the present invention.

FIG. 5 is a cross-sectional side view showing a spacer liner on the vertical sidewalls of the sacrificial liner, and an exposed portion of the sacrificial liner on the horizontal surfaces, in accordance with an embodiment of the present invention.

In one or more embodiments, a spacer liner 150 can be formed on the sacrificial liner 140 over the vertical fins 111 and the substrate 110, where the spacer liner 150 can be formed by a conformal deposition.

In one or more embodiments, the spacer liner 150 can be silicon nitride (SiN), silicon oxynitride (SiON), silicon oxycarbide (SiOC), or combinations thereof. The spacer liner 150 can be the same material as the protective liner layer 130 or the spacer liner 150 and the protective liner layer 130 can be different materials to allow selective removal of the spacer liner 150.

In one or more embodiments, the spacer liner 150 can have a thickness in the range of about 2 nm to about 5 nm.

In one or more embodiments, a portion of the spacer liner 150 can be removed from the horizontal surfaces of the vertical fins 111 and substrate 110, while the portion of the spacer liner 150 on the vertical surfaces can remain. In various embodiments, the portion of the spacer liner 150 on the horizontal surfaces can be removed by a directional, selective etch, for example, a reactive ion etch (RIE), that can selectively remove portions of the spacer liner 150 on which the reactive ion beam is incident, while leaving portions of the spacer liner 150 approximately parallel with the ion beam essentially unetched. Removal of the portions of the spacer liner 150 can expose portions of the sacrificial liner 140.

Figure 6:
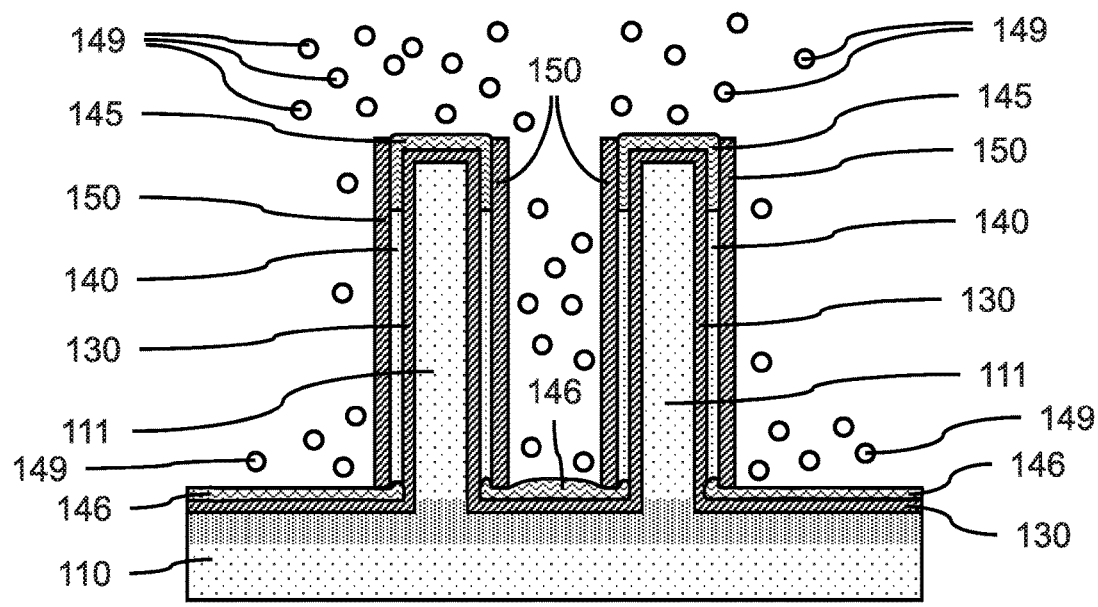
FIG. 6 is a cross-sectional side view showing conversion caps and conversion segments formed from the exposed portions of the sacrificial liner, in accordance with an embodiment of the present invention.

FIG. 6 is a cross-sectional side view showing conversion caps and conversion segments formed from the exposed portions of the sacrificial liner, in accordance with an embodiment of the present invention.

In one or more embodiments, the exposed portion of the sacrificial liner 140 can be converted to a different material through a chemical reaction by exposure to a reactive species 149. A portion of the sacrificial liner 140 on the vertical fins 111 can be converted to conversion caps 145, where the reactive species can diffuse into a portion of the sacrificial liner 140 covered by the spacer liner 150. An exposed portion of the sacrificial liner 140 can be converted to conversion segments 146 on the protective liner layer 130 over the substrate 110 and between the vertical fins 111.

In various embodiments, the thickness of the protective liner layer 130 and the conversion caps 145 and conversion segments 146 can be controlled by the conformal deposition and conversion reaction with the reactive species 149. Portions of the conversion caps 145 and conversion segments 146 can be thicker than the initial sacrificial liner 140 due to incorporation of the reactive species into the sacrificial liner.

In a non-limiting exemplary embodiments, the sacrificial liner 140 can be silicon (Si) and the reactive species 149 can be an oxidizing species (e.g., $O_2$, $O_3$, $H_2O$, etc.) that can convert the Si into silicon oxide (SiO), for example, $SiO_2$. In various embodiments, the chemical reaction can be a wet oxidation using $O_2$ to form $SiO_2$.

Figure 7:
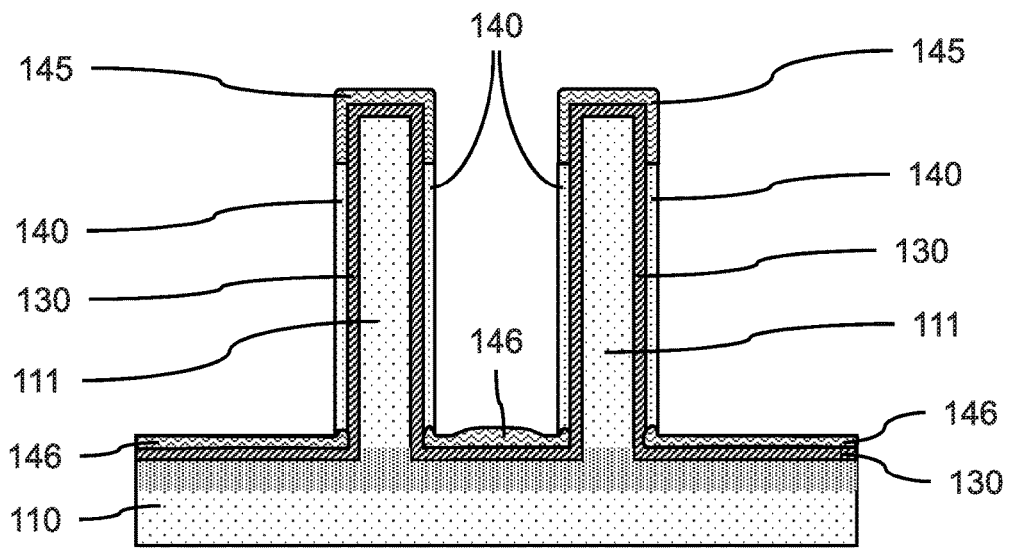
FIG. 7 is a cross-sectional side view showing exposed conversion caps and conversion segments, and the remaining portions of the sacrificial liner after removal of the spacer liner, in accordance with an embodiment of the present invention.

FIG. 7 is a cross-sectional side view showing exposed conversion caps and conversion segments, and the remaining portions of the sacrificial liner after removal of the spacer liner, in accordance with an embodiment of the present invention.

In one or more embodiments, the exposed portions of the spacer liner 150 can be removed to expose the underlying sacrificial liner 140 and conversion caps 145, where the spacer liner can be removed by a selective isotropic etch.

Figure 8:
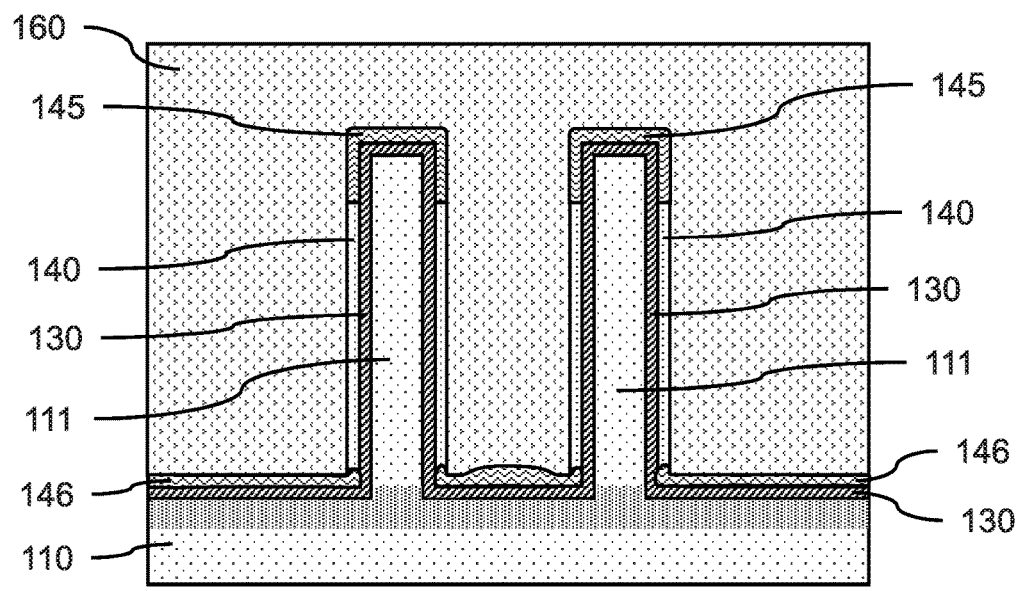
FIG. 8 is a cross-sectional side view showing a fill layer on the sacrificial liner, conversion caps, and conversion segments, in accordance with an embodiment of the present invention.

FIG. 8 is a cross-sectional side view showing a fill layer on the sacrificial liner, conversion caps, and conversion segments, in accordance with an embodiment of the present invention.

In one or more embodiments, a fill layer 160 can be formed on the sacrificial liner 140, conversion caps 145, and conversion segments 146, where the fill layer 160 can be blanket deposited, for example, by chemical vapor deposition (CVD), plasma enhanced CVD (PECVD), physical vapor deposition (PVD), spun on, or combinations thereof. The fill layer 160 can extend above the top surfaces of the conversion caps 145, and a chemical-mechanical polishing (CMP) used to remove a portion of the fill layer.

In one or more embodiments, the fill layer 160 can be amorphous carbon (a-C), silicon nitride (SiN), silicon oxycarbide (SiOC), silicon oxynitride (SiON), and combinations thereof, where the fill layer 160 can be selectively removed from the sacrificial liner 140, conversion caps 145, and conversion segments 146.

Figure 9:
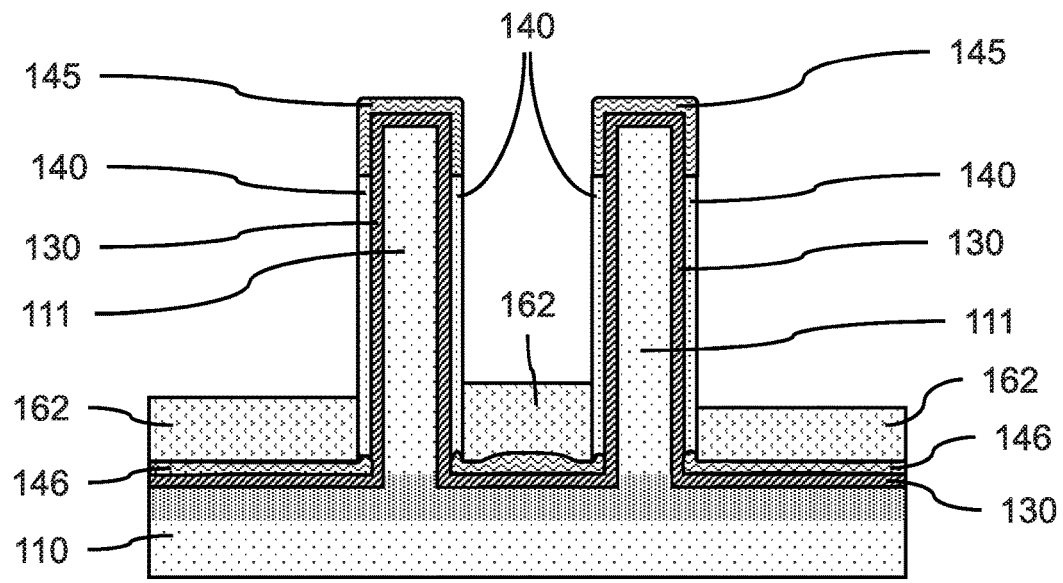
FIG. 9 is a cross-sectional side view showing the fill layer with varying reduced heights adjacent to the vertical fins, in accordance with an embodiment of the present invention.

FIG. 9 is a cross-sectional side view showing the fill layer with varying reduced heights adjacent to the vertical fins, in accordance with an embodiment of the present invention.

In one or more embodiments, the height of the fill layer 160 can be reduced to form fill blocks 162 and expose the conversion caps 145 and portions of the sacrificial liner 140. The height of the fill layer 160 can be reduced by a selective and/or directional etch (e.g., RIE). The reduction in height of the fill layer 160 may not be uniform, but because the fill layer 160 does not form a bottom spacer, and the fill blocks 162 can be subsequently removed, the inconsistent heights do not affect the device structure or performance.

Figure 10:
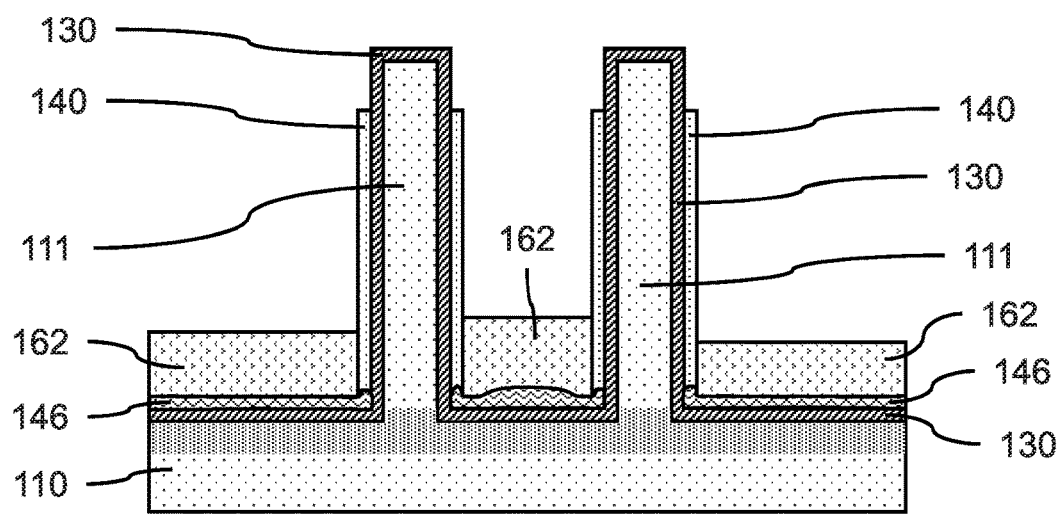
FIG. 10 is a cross-sectional side view showing an exposed portion of the protective liner layer after removal of the conversion caps from each vertical fin, in accordance with an embodiment of the present invention.

FIG. 10 is a cross-sectional side view showing an exposed portion of the protective liner layer after removal of the conversion caps from each vertical fin, in accordance with an embodiment of the present invention.

In one or more embodiments, the conversion caps 145 can be selectively removed (e.g., selective wet etch or dry plasma etch) from each vertical fin 111 to expose a portion of the protective liner layer 130 on an upper portion of the vertical fin 111. The sacrificial liner 140 can remain on the sidewalls of the vertical fins 111. A lower portion of the sacrificial liner 140 can be covered by a fill block 162.

Figure 11:
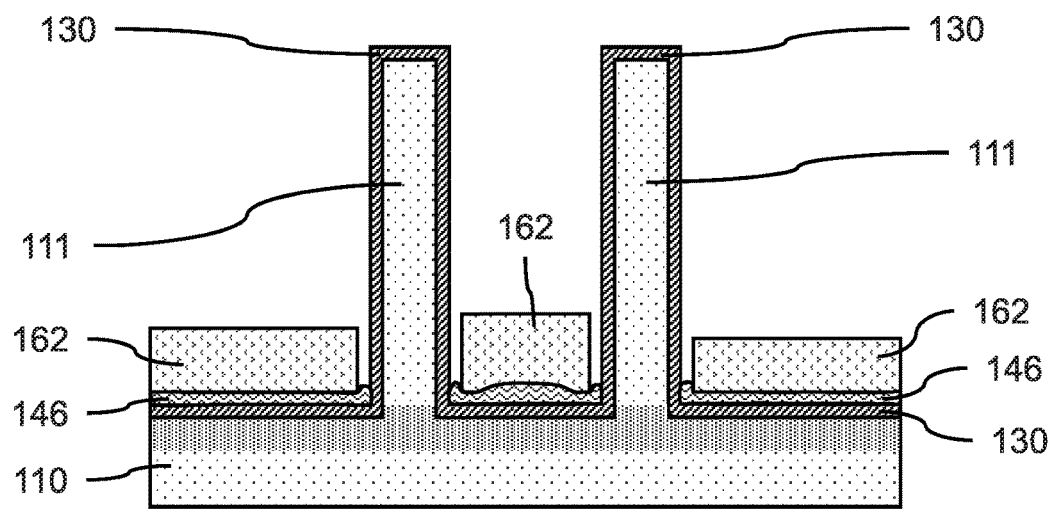
FIG. 11 is a cross-sectional side view showing an exposed protective liner layer on the sidewalls of the vertical fins after removal of the remaining portions of the sacrificial liner, in accordance with an embodiment of the present invention.

FIG. 11 is a cross-sectional side view showing an exposed protective liner layer on the sidewalls of the vertical fins after removal of the remaining portions of the sacrificial liner, in accordance with an embodiment of the present invention.

In one or more embodiments, the sacrificial liner 140 can be selectively removed to expose the underlying protective liner layer 130 (e.g., by a wet etch), where the protective liner layer 130 and conversion segments 146 can act as an etch stop. A portion of the conversion segments 146 can be exposed by removal of the remaining portion of the sacrificial liner 140. There can be a gap between the fill blocks 162 and protective liner layer 130 formed by removal of the sacrificial liner 140.

Figure 12:
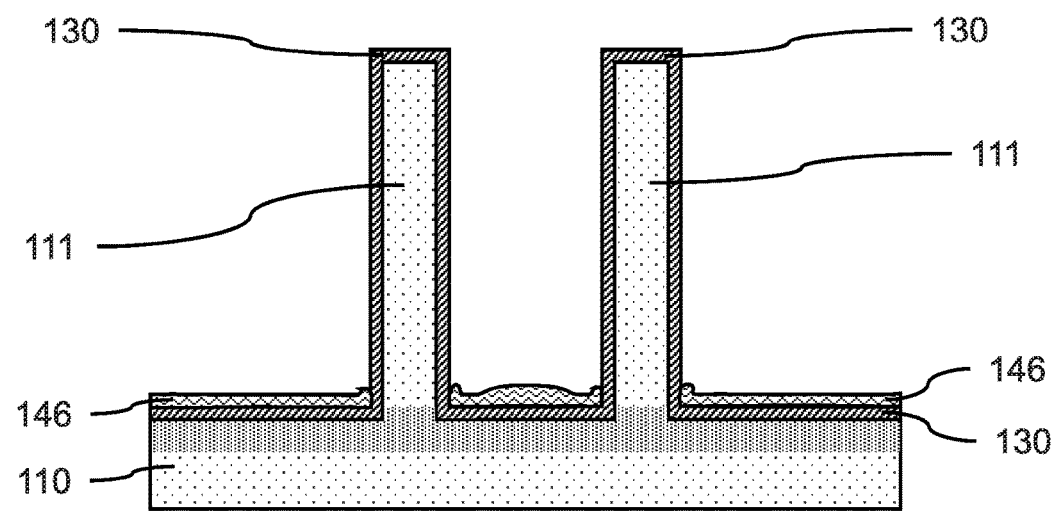
FIG. 12 is a cross-sectional side view showing the exposed protective liner layer and conversion segments after removal of the filler blocks, in accordance with an embodiment of the present invention.

FIG. 12 is a cross-sectional side view showing the exposed protective liner layer and conversion segments after removal of the filler blocks, in accordance with an embodiment of the present invention.

In one or more embodiments, the fill blocks 162 can be removed by a selective etch to expose the underlying conversion segments 146. The conversion segments 146 can cover the protective liner layer 130 on the substrate and a portion of the protective liner layer 130 on the sidewalls of the vertical fins 111. In various embodiments, the conversion segments 146 can cover the protective liner layer 130 on the sidewalls of the vertical fins 111 to a height in the range of about 2 nm to about 7 nm.

Figure 13:
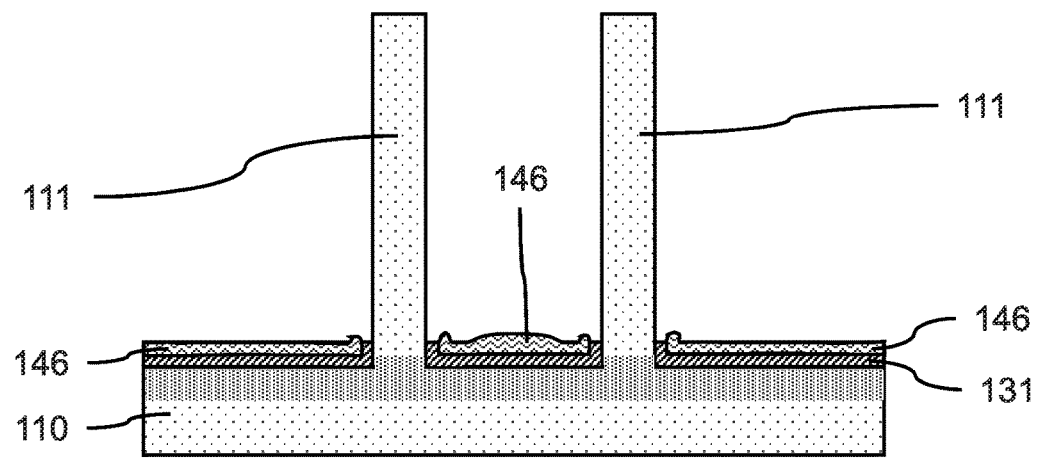
FIG. 13 is a cross-sectional side view showing exposed vertical fins after removal of the exposed portions of the protective liner layer, in accordance with an embodiment of the present invention.

FIG. 13 is a cross-sectional side view showing exposed vertical fins after removal of the exposed portions of the protective liner layer, in accordance with an embodiment of the present invention.

In one or more embodiments, the exposed portions of the protective liner layer 130 can be removed by a selective etch to expose the vertical fins 111, while leaving protective liner segments 131 on the surface of the substrate and covering a lower portion of the vertical fins 111. The conversion segment 146 can be on part of the protective liner segment 131, while an end face of the protective liner segment can be exposed.

Figure 14:
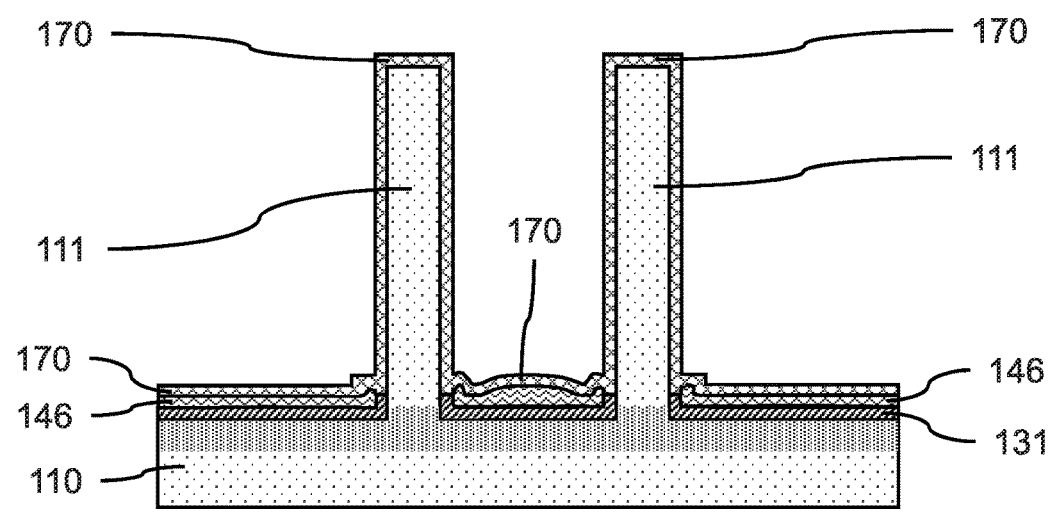
FIG. 14 is a cross-sectional side view showing a gate dielectric layer on the exposed surfaces of the vertical fins including recesses between the conversion segments and vertical fin sidewalls, in accordance with an embodiment of the present invention.

FIG. 14 is a cross-sectional side view showing a gate dielectric layer on the exposed surfaces of the vertical fins including recesses between the conversion segments and vertical fin sidewalls, in accordance with an embodiment of the present invention.

In one or more embodiments, a gate dielectric layer 170 can be formed on the exposed surfaces of the vertical fins 111, protective liner segment 131, and conversion segments 146, where the gate dielectric layer 170 can be conformally deposited.

In one or more embodiments, the gate dielectric layer 170 can be an insulating dielectric layer, for example, a silicon oxide (SiO), silicon nitride (SiN), silicon oxynitride (SiON), a high-K dielectric, or a suitable combination of these materials.

In one or more embodiments, the gate dielectric layer 170 can have a thickness in the range of about 1 nm to about 4 nm, or can have a thickness in the range of about 1 nm to about 2 nm. The gate dielectric layer 170 can have a contour that follow the shape and varying thicknesses of the conversion segments 146.

Figure 15:
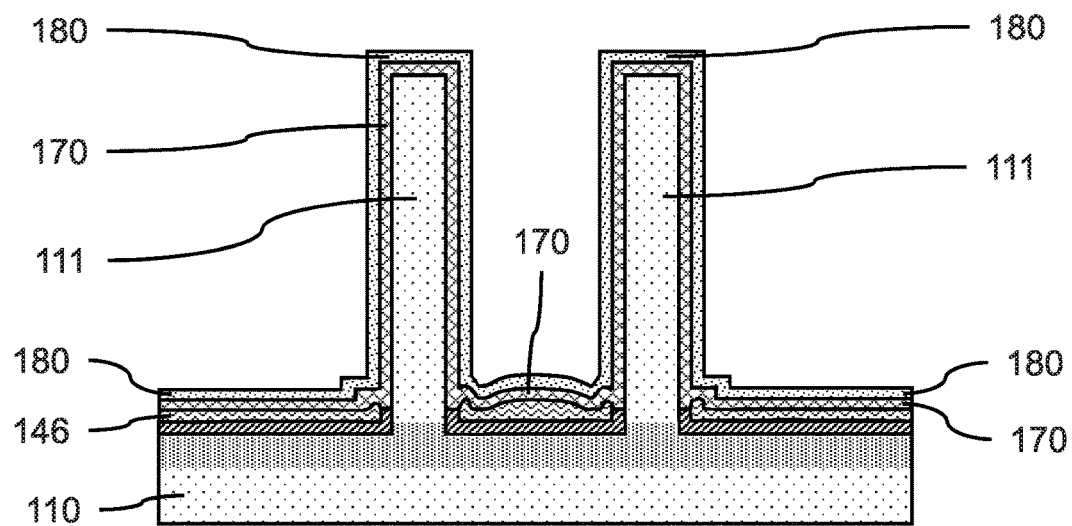
FIG. 15 is a cross-sectional side view showing a work function layer on the gate dielectric layer, in accordance with an embodiment of the present invention.

FIG. 15 is a cross-sectional side view showing a work function layer on the gate dielectric layer, in accordance with an embodiment of the present invention.

In one or more embodiments, a work function layer 180 can be formed on the exposed surfaces of the gate dielectric layer 170, where the work function layer 180 can be conformally deposited by ALD, PEALD, CVD, PECVD, or combinations thereof.

In one or more embodiments, a work function layer 180 can be formed on the gate dielectric layer 170, where the work function layer 180 and gate dielectric layer 170 can surround at least a portion of each of one or more vertical fin(s) 111 as a part of a gate structure. The work function layer 180 can be formed on the gate dielectric layer 170 to adjust the electrical properties of a gate electrode. In various embodiments, the work function layer 180 can be optional. A portion of the work function layer 180 can be formed on the gate dielectric layer 170 on the sidewalls of the vertical fins 111. In various embodiments, different work function layers 180 can be formed for the nFETs and pFETs, respectively.

In various embodiments, a work function layer 180 can be a conductive nitride, a conductive carbide, or combinations thereof. The work function layer 180 can include multiple layers of work function materials, for example, a work function layer can be a titanium nitride/titanium carbide (TiN/TiC) stack.

In various embodiments, the work function layer 180 can have a thickness in the range of about 1 nm to about 11 nm, or can have a thickness in the range of about 3 nm to about 5 nm.

Figure 16:
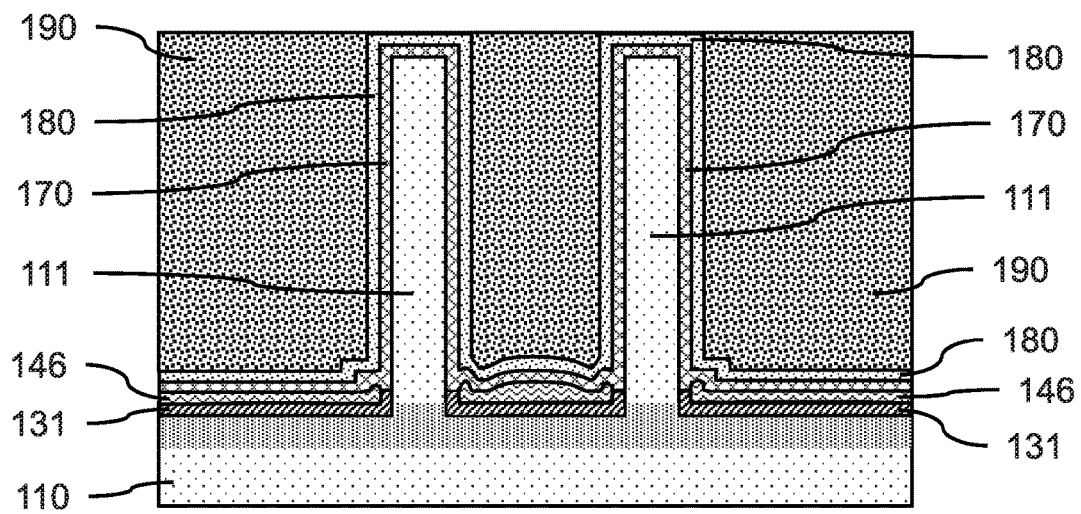
FIG. 16 is a cross-sectional side view showing a gate fill layer on the work function layer, in accordance with an embodiment of the present invention.

FIG. 16 is a cross-sectional side view showing a gate fill layer on the work function layer, in accordance with an embodiment of the present invention.

In one or more embodiments, a gate fill layer 190 can be formed on the gate dielectric layer 170 and/or work function layer 1805 if present, where the gate fill layer 190 can fill in the space between vertical fins 111. The gate fill layer 190, gate dielectric layer 170, and optionally the work function layer 180, can form a gate structure on one or more vertical fin(s) 111, where the gate fill layer 190 and work function layer 180 can form a conductive gate electrode.

In various embodiments, the gate fill layer 190 can be doped polycrystalline or amorphous silicon, germanium, silicon-germanium, a metal (e.g., tungsten, titanium, copper, etc), a conducting metallic compound material (e.g., tantalum nitride, titanium nitride, tantalum carbide, titanium carbide, nickel silicide, etc.), carbon nanotube, conductive carbon, graphene, or any suitable combination of these materials. The conductive material may further comprise dopants that are incorporated during or after deposition.

In one or more embodiments, the gate fill layer 190 can be blanket deposited, and a chemical-mechanical polishing (CMP) used to remove gate fill layer material that extends above the top surfaces of the gate dielectric layer 170 and/or work function layer 180 if present, where the CMP can provide a smooth, flat surface.

Figure 17:
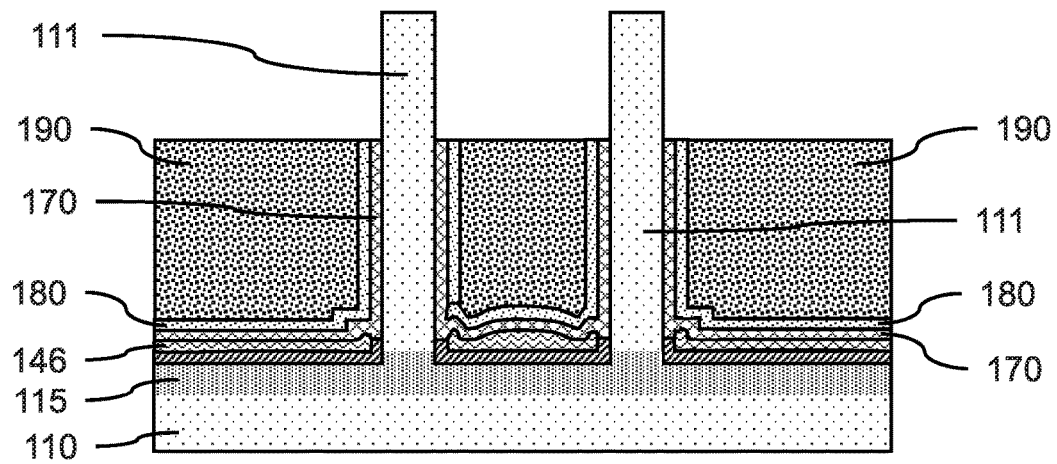
FIG. 17 is a cross-sectional side view showing a gate structure with a reduced height on each of the vertical fins, in accordance with an embodiment of the present invention.

FIG. 17 is a cross-sectional side view showing a gate structure with a reduced height on each of the vertical fins, in accordance with an embodiment of the present invention.

In one or more embodiments, the height of the gate fill layer 190 can be reduced by a directional etch-back, and the work function layer 180 and gate dielectric layer 170 can be removed to expose an upper portion of the vertical fins 111.

Figure 18:
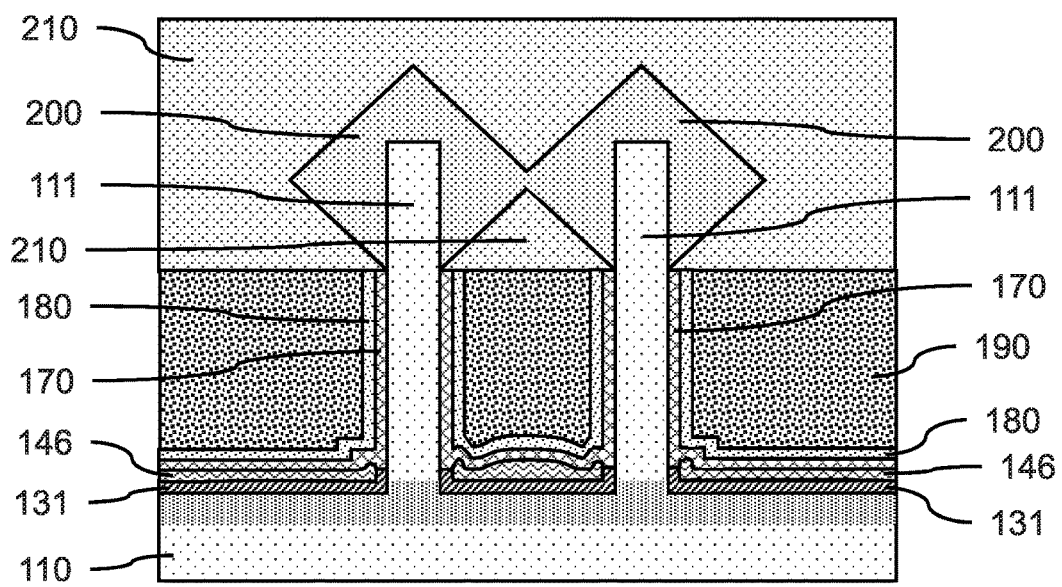
FIG. 18 is a cross-sectional side view showing merged top source/drains formed on the exposed portions of the vertical fins, and an interlayer dielectric on the gate structures and top source/drains, in accordance with an embodiment of the present invention.

FIG. 18 is a cross-sectional side view showing merged top source/drains formed on the exposed portions of the vertical fins, and an interlayer dielectric layer on the gate structures and top source/drains, in accordance with an embodiment of the present invention.

In one or more embodiments, a top source/drain 200 can be formed on each of the vertical fins 111, where the top source/drains 200 can be formed by an epitaxial growth on the exposed surfaces of the vertical fins 111. The top source/drains 200 can be grown until adjacent top source/drains 200 merge to form a single merged top source/drain 200 spanning two or more vertical fins 111.

In one or more embodiments, an interlayer dielectric (ILD) layer 210 can be formed on the top source/drains 200 and exposed surfaces of the gate fill layer 190, work function layer 180, and gate dielectric layer 170 to electrically insulate one or more vertical fin field effect transistor devices (i.e., FinFETs) formed on the substrate. Vias and electrical contacts can be formed to the top source/drains 200 and gate structures to form functioning FinFETs.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transport field effect transistor with uniform bottom spacer thickness, comprising:
   a vertical fin on a substrate;
   a protective liner segment on the substrate adjacent to the vertical fin;
   a conversion segment on the protective liner segment, wherein the conversion segment includes silicon oxide (SiO); and
   a gate dielectric layer on the conversion segment, wherein the gate dielectric layer follows the shape and varying thickness of the conversion segment.

2. The vertical transport field effect transistor of claim 1, wherein the protective liner segment is silicon nitride (SiN).

3. The vertical transport field effect transistor of claim 1, wherein the protective liner segment has a thickness in a range of about 2 nm to about 5 nm.

4. The vertical transport field effect transistor of claim 1, further comprising a top source/drain on the vertical fin.

5. The vertical transport field effect transistor of claim 1, further comprising a work function layer on the gate dielectric layer and a gate fill layer on the work function layer.

6. The vertical transport field effect transistor of claim 5, wherein the protective liner segment covers a lower portion of the vertical fin.

7. The vertical transport field effect transistor of claim 6, wherein the conversion segment and protective liner segment forms a bottom spacer on the substrate.

8. A vertical transport field effect transistor with uniform bottom spacer thickness, comprising:
   a plurality of vertical fins on a substrate;
   a plurality of protective liner segments on the substrate;
   a conversion segment on each of the plurality of protective liner segments, wherein the conversion segment includes silicon oxide (SiO);
   a gate dielectric layer on each of the conversion segments, wherein the gate dielectric layer follows the shape and varying thickness of the conversion segment; and
   a top source/drain on each of the plurality of vertical fins.

9. The vertical transport field effect transistor of claim 8, wherein the plurality of protective liner segments are silicon nitride (SiN).

10. The vertical transport field effect transistor of claim 8, wherein the plurality of protective liner segments have a thickness in the range of about 2 nm to about 5 nm.

11. The vertical transport field effect transistor of claim 8, wherein the top source/drain is a merged top source/drain that spans the plurality of vertical fins.

12. The vertical transport field effect transistor of claim 8, wherein the plurality of conversion segments each covers one of the protective liner segments on a sidewall of at least one of the plurality of vertical fins to a height in a range of about 2 nm to about 7 nm.

13. A vertical transport field effect transistor with uniform bottom spacer thickness, comprising:
   a plurality of vertical fins on a substrate;
   a plurality of protective liner segments on the substrate;
   a conversion segment on each of the plurality of protective liner segments, wherein the plurality of conversion segments each covers one of the protective liner segments on a sidewall of at least one of the plurality of vertical fins to a predetermined height, and wherein the conversion segment includes silicon oxide (SiO);
   a gate dielectric layer on the conversion segments, wherein the gate dielectric layer follows the shape and varying thickness of the conversion segment; and
   a top source/drain on each of the plurality of vertical fins.

14. The vertical transport field effect transistor of claim 13, wherein the plurality of conversion segments each covers one of the protective liner segments on a sidewall of at least one of the plurality of vertical fins to a height in a range of about 2 nm to about 7 nm.

15. The vertical transport field effect transistor of claim 14, wherein the plurality of protective liner segments have a thickness in the range of about 2 nm to about 5 nm.

16. The vertical transport field effect transistor of claim 15, wherein each of the conversion segments on the protective liner segments forms a bottom spacer on the substrate.

17. The vertical transport field effect transistor of claim 16, further comprising a work function layer on the gate dielectric layer and a gate fill layer on the work function layer.

* * * * *